(12) United States Patent
Lytle et al.

(10) Patent No.: US 10,634,892 B2
(45) Date of Patent: Apr. 28, 2020

(54) SYSTEMS AND METHODS FOR GENERATING A STRUCTURED ILLUMINATION IMAGE

(71) Applicant: LIFE TECHNOLOGIES CORPORATION, Carlsbad, CA (US)

(72) Inventors: Steven Lytle, Kirkland, WA (US); Paul Boeschoten, Redmond, WA (US); Andrew Gunderson, Bothell, WA (US); Larry Rystrom, Mill Creek, WA (US); Chris Gnehm, Bothell, WA (US)

(73) Assignee: Life Technologies Corporation, Carlsbad, CA (US)

( * ) Notice: Subject to any disclaimer, the term of this patent is extended or adjusted under 35 U.S.C. 154(b) by 108 days.

(21) Appl. No.: 15/826,021

(22) Filed: Nov. 29, 2017

(65) Prior Publication Data

US 2018/0157021 A1    Jun. 7, 2018

Related U.S. Application Data

(63) Continuation of application No. PCT/US2016/031568, filed on May 10, 2016.
(Continued)

(51) Int. Cl.
*G02B 21/00* (2006.01)
*G02B 21/36* (2006.01)
(Continued)

(52) U.S. Cl.
CPC ....... *G02B 21/0076* (2013.01); *G01N 21/645* (2013.01); *G01N 21/6458* (2013.01);
(Continued)

(58) Field of Classification Search
CPC . G02B 21/0076; G02B 21/367; G03F 7/2004; G01N 21/645; G01N 21/6458; G01N 2021/6463; G01N 2021/6478
(Continued)

(56) References Cited

U.S. PATENT DOCUMENTS

2002/0097490 A1*   7/2002   Endo ................. G02B 21/0044
                                                    359/388
2004/0257562 A1*  12/2004   Wachsmuth .......... G01J 3/4406
                                                    356/317
(Continued)

FOREIGN PATENT DOCUMENTS

EP          2034349        3/2009
JP        2005-214728      8/2005
(Continued)

OTHER PUBLICATIONS

PCT/US2016/031568, "International Search Report", dated Aug. 9, 2016, 5 Pages.

*Primary Examiner* — Jennifer D. Carruth
(74) *Attorney, Agent, or Firm* — Workman Nydegger

(57) ABSTRACT

A method for generating a composite image obtained in a fluorescence imaging system, comprising: determining the physical locations of a pinhole mask relative to a sample required to construct a full composite confocal image; generating in a control module a randomized order for the determined physical locations; moving the photomask or the sample to the determined physical locations in the randomized order under control of the control module and using a translation stage; illuminating the sample through the photomask using an excitation light; capturing a plurality of images at each of the physical locations using a sensor in order to generate a set of data points; using the randomized order to generate a composite image based on the set of data points and measuring the brightness of at least some of the data points; and adjusting the brightness of some of the set of data points.

20 Claims, 9 Drawing Sheets

Related U.S. Application Data

(60) Provisional application No. 62/169,669, filed on Jun. 2, 2015.

(51) Int. Cl.
 G01N 21/64 (2006.01)
 G03F 7/20 (2006.01)

(52) U.S. Cl.
 CPC ......... G02B 21/367 (2013.01); G03F 7/2004 (2013.01); *G01N 2021/6463* (2013.01); *G01N 2021/6478* (2013.01)

(58) Field of Classification Search
 USPC ........................................ 359/227, 368, 385
 See application file for complete search history.

(56) References Cited

U.S. PATENT DOCUMENTS

| | | | | |
|---|---|---|---|---|
| 2006/0157638 | A1* | 7/2006 | Takamizawa | G01N 21/6458 250/205 |
| 2007/0057211 | A1* | 3/2007 | Bahlman | G01N 21/6452 250/584 |
| 2009/0046164 | A1 | 2/2009 | Shroff et al. | |
| 2010/0278400 | A1* | 11/2010 | Piestun | G01N 21/6456 382/128 |
| 2012/0256101 | A1 | 10/2012 | Ye et al. | |
| 2012/0257197 | A1* | 10/2012 | Feldkhun | G01N 21/4795 356/301 |
| 2015/0260978 | A1* | 9/2015 | Cremer | G02B 21/0004 348/79 |
| 2016/0327779 | A1* | 11/2016 | Hillman | G02B 21/367 |
| 2018/0157022 | A1* | 6/2018 | Lytle | G01N 21/274 |

FOREIGN PATENT DOCUMENTS

| | | |
|---|---|---|
| JP | 2012-504252 | 2/2012 |
| JP | 2012-078408 | 4/2012 |
| JP | 2015-084057 | 4/2015 |

* cited by examiner

SYSTEMS AND METHODS FOR GENERATING A STRUCTURED ILLUMINATION IMAGE

This application is a continuation of International Patent Application No. PCT/US2016/031568 filed May 10, 2016, which claims the benefit of priority to U.S. Provisional Application No. 62/169,669 filed Jun. 2, 2015, which disclosures are herein incorporated by reference in their entirety.

BACKGROUND

Technical Field

The embodiments described herein are related to fluorescence imaging, and more particularly to generating a composite confocal image in a fluorescence imaging system, while reducing certain visual artifacts.

Related Art

A fluorescence microscope is a light microscope used to study properties of organic or inorganic substances using fluorescence instead of, or in addition to, reflection and absorption. The fluorescence microscope is based on the phenomenon that certain material emits energy detectable as visible light when irradiated with the light of a specific wavelength. The sample can either be fluorescing in its natural form (like chlorophyll) or it may be treated with a fluorescing stain.

A basic widefield fluorescence microscope that is well known in the art includes a light source and several filters that correspond to a wavelength matching a fluorescence stain. An excitation filter is provided for selecting an excitation wavelength of light from the light source, and a dichroic beamsplitter reflects light from the light source to illuminate the specimen. The illuminated light is separated from the much weaker emitted fluorescence with an emission filter. The fluorescing areas can be observed in the microscope and shine out against a dark background with high contrast.

A structured illumination imaging system uses much the same principle as the widefield imaging system described above, with the key that only a portion of the sample is illuminated at any one time. A large portion of the excitation light is blocked, while a pattern of unblocked illumination is swept over the entire sample such that each area of the sample receives approximately equal excitation light. Typically, multiple images are captured at discrete intervals in this process and a single fully illuminated image is generated by an image processing algorithm which analyzes the discrete input images to construct a corresponding output image. This output image is superior to an image captured using simple widefield imaging techniques due to the reduction in light gathered from out of focus areas of the sample, resulting in improved signal to noise ratio, higher lateral and axial spatial resolution, or both.

A confocal imaging system is a type of structured illumination system. A confocal imaging system can be used to improve the signal to noise ratio or increase the optical resolution. In a confocal imaging system, the objective is to image only the thin part of the sample that is in focus, rejecting all light from above and below the focus plane. This is in contrast to more basic wide-field imaging, where out-of-focus elements still appear as significant elements in the image.

Conventional confocal systems can be divided loosely into single-point confocal and multi-point confocal systems. In single-point confocal systems the illumination used to excite the dye is passed through a pinhole onto the sample, then the fluorescent emission from the sample is passed through another pinhole into a photodetector. The pinhole size and optics are designed to accept light back from only those photons emitted from the thin slice of the sample that is in focus.

The technique can only image one point at a time. Accordingly, the beam or the sample must be scanned back and forth in two dimensions to construct a single 2D confocal image. The beam in such conventional systems is typically scanned over a fixed sample, which requires very fast, very accurate mirrors to be synchronized to the photodetector.

In a multi-point confocal system the operational principle is the same as above but multiple points are imaged in parallel. Typically a disk with a pattern of pinholes is spun such that the illumination is swept over the field of view during an exposure. An example spinning-disk confocal imaging system is illustrated in FIG. 7.

As can be seen in FIG. 7, light 802 from the light source is incident on a first disk 804 that includes a plurality of focusing lenses 806 that focus the light onto a pinhole mask 810 included in a second disk 808. Light 802 passing through pinhole mask 810 is then focused onto the specimen 814 via objective lens 812. The light 802 is absorbed by fluorophores, which causes them to emit light 816, which passes back through objective lens 812 and pinhole mask 810 and is incident on mirror 818. Mirror 818 reflects the emitted light 816 onto a sensor 822, e.g., via optics 820, where it can be detected.

A system such as that illustrated in FIG. 7 can capture images faster than a single-point system but such a system also requires more complex synchronization between pinholes and detectors.

Another issue with such conventional fluorescence imaging system is photobleaching. In such systems, viewing a sample causes the sample to become dimmer over time. This effect, known as photobleaching, is the result of the energy of the excitation light slowly damaging the molecules of the dye and consequently reducing its fluorescent response. This effect is only evident in areas of the sample that have been exposed to excitation light and varies based on the duration and intensity of exposure. It is therefore possible for one area of the sample to be very dim (very photobleached) and another area to be very bright (not at all photobleached) even though there is no appreciable difference in the biology of the sample.

In structured illumination applications this effect can cause qualitative and quantitative problems. The basic concept of structured illumination is to light only a small portion of the sample at a time, then combine multiple partially lit views of the sample into one fully lit view with image processing software. This takes advantage of certain characteristics of light and optics to capture an image that would not be possible with standard wide-field illumination. The sample is typically over-illuminated, so that more area than just the subset of the sample area being imaged at any one time is receiving light. This causes photobleaching in areas of the sample that may not yet have been imaged, so that when they are imaged the apparent brightness is less than it would have been had this area been imaged earlier in the process. When the images are combined, this can cause strong artificial periodic trends in quantitative analysis and visually evident patterns in qualitative analysis.

There are several conventional ways of overcoming this problem. First, the capture settings can be changed as the capture process progresses in order to compensate for the lower brightness due to photobleaching. But this approach requires all elements of the system to be very well quantified with respect to several variables and may need to be calibrated for the individual sample. Second, the brightness of individual images can be adjusted in post-processing to compensate for the decreasing brightness. Third, a more focused illumination source (such as a laser) can prevent much of the over-illumination that causes the extra photobleaching.

SUMMARY

Systems and methods for a fluorescence imaging system that can be used to generate a composite confocal image with reduced periodic visual artifacts are disclosed herein.

According to one aspect, a method for generating a composite image obtained in a fluorescence imaging system, comprising: determining the physical locations of a pinhole mask relative to a sample required to construct a full composite confocal image; generating in a control module a randomized order for the determined physical locations; moving the photomask or the sample to the determined physical locations in the randomized order under control of the control module and using a translation stage; illuminating the sample through the photomask using an excitation light; capturing a plurality of images at each of the physical locations using a sensor in order to generate a set of data points; using the randomized order to generate a composite image based on the set of data points and measuring the brightness of at least some of the data points; and adjusting the brightness of some of the set of data points, based on a model of certain observed imaging effects in order to eliminate such imaging effects in the generated image.

According to another aspect, a fluorescence imaging system comprises a photomask; a control module configured to determine the physical locations of the photomask relative to a sample required to construct a full composite image of the sample and to generate a randomized order for the determined physical locations; an illumination source configured to illuminate the sample through the photomask using an excitation light; one or more motors configured to move the photomask in accordance with the randomized order generated by the control module; a sensor configured to capture a plurality of images of the sample to generate a set of data points; an image generation module configured to use the randomized order to generate a composite image based on the set of data points and measuring the brightness of at least some of the data points and adjust the brightness of some of the data points, based on a model of certain observed imaging effects in order to eliminate such imaging effects in the generated image.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

In the embodiments described herein, systems, apparatuses, and methods for producing a composite confocal image are disclosed. It will be understood that the embodiments described are by way of example only. Moreover, the figures are illustrative and intended to aid the description of the systems and methods disclosed. Thus, the figures may not comprise all of the components, circuitry, elements, etc., needed to depict a complete system. Thus, the figures and the accompanying disclosure should not be viewed as limiting the embodiments to certain configurations, nor should they be viewed as foreclosing the inclusion of further components, etc., in the configurations disclosed, or of further configurations.

As noted above, a structured illumination system has certain advantages over a conventional widefield system. A confocal imaging system is a type of structured illumination system. A confocal imaging system can be used to increase the optical resolution and contrast and enable the reconstruction of three-dimensional structures from a series of obtained images. In a confocal imaging system, the objective is to image only the thin part of the sample that is in focus, rejecting all light from above and below the focus plane. This is in contrast to more basic wide-field imaging, where out-of-focus elements still appear as significant elements in the image.

Conventional confocal systems can be divided loosely into single-point confocal and multi-point confocal systems. In single-point confocal systems the illumination used to excite the dye is passed through a pinhole onto the sample, then the fluorescent emission from the sample is passed through another pinhole into a photodetector, i.e., it is essentially a single pixel camera. The pinhole size and optics are designed to accept light back from only those photons emitted from the thin slice of the sample that is in focus.

The technique can only image one point, i.e., one pixel of an image, at a time. Accordingly, the beam or the sample must be scanned back and forth in two dimensions to construct a single 2D confocal image. The beam in such conventional systems is typically scanned over a fixed sample, which requires very fast, very accurate mirrors to be synchronized to the photodetector.

In a multi-point confocal system the operational principle is the same as above but multiple points are imaged in parallel. Typically a disk with a pattern of pinholes is spun such that the illumination is swept over the field of view during an exposure. An example spinning-disk confocal imaging system is illustrated in FIG. 7.

Figure 7:
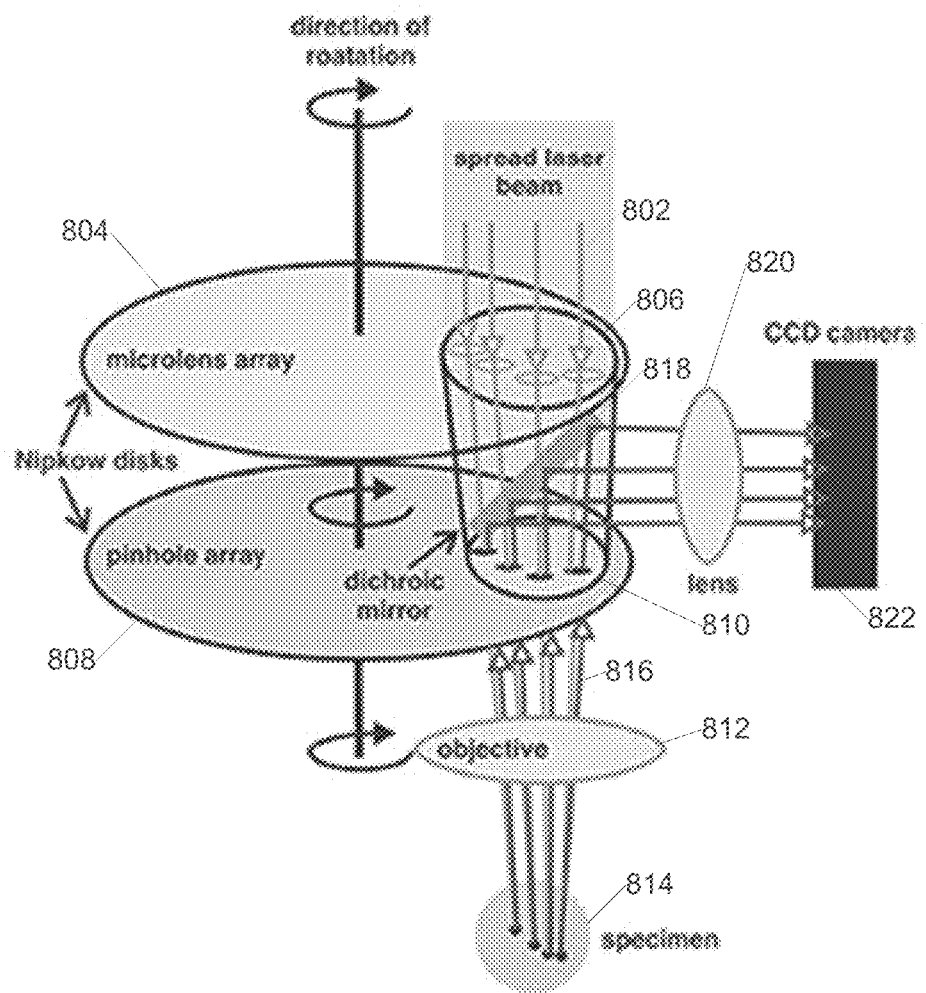
FIG. 7 is a diagram illustrating a conventional spinning-disk confocal imaging system.

As can be seen in FIG. 7, light 802 from the light source is incident on a first disk 804 that includes a plurality of focusing lenses 806 that focus the light onto a pinhole mask 810 included in a second disk 808. Light 802 passing through pinhole mask 810 is then focused onto the specimen 814 via objective lens 812. The light 802 is absorbed by fluorophores, which causes them to emit light 816, which passes back through objective lens 812 and pinhole mask 810 and is incident on mirror 818. Mirror 818 reflects the emitted light 816 onto a sensor 822, e.g., via optics 820, where it can be detected.

A system such as that illustrated in FIG. 7 can capture images faster than a single-point system but such a system also requires more complex synchronization between pinholes and detectors.

Figure 1:
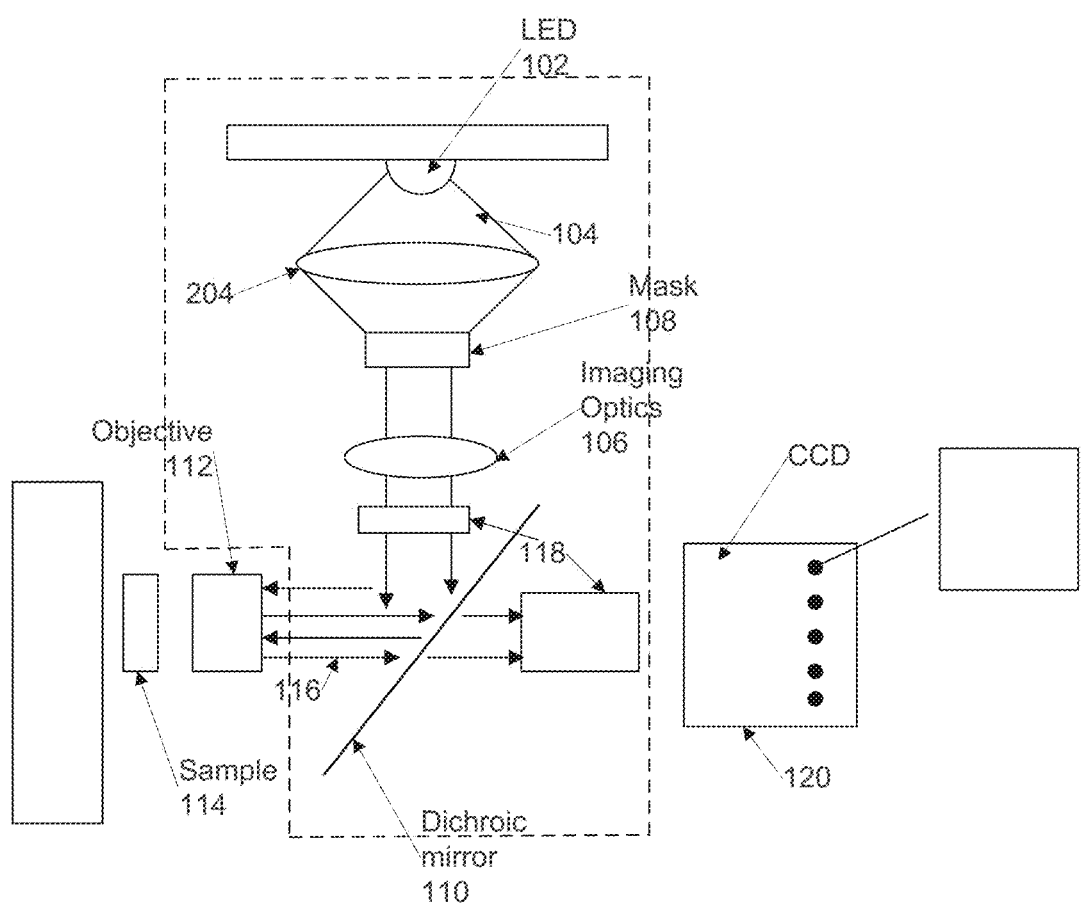
FIG. 1 is a diagram illustrating an example fluorescence imaging system configured in accordance with one embodiment.

FIG. 1 is a diagram illustrating an example embodiment of a fluorescence imaging system 100 configured in accordance with the systems and methods described herein. FIG. 1 illustrates the systems and methods described herein in the context of a structured illumination microscope. The elements in the region enclosed by the dotted line are included in the light cube 200 illustrated in FIG. 2. These elements include the light source 102, illumination optics 204 (in FIG. 2), photomask imaging optics 106, a photomask 108 and a mirror 110, which is often a dichroic mirror or beamsplitter and which directs at least a portion of the structured illumination pattern through an objective lens 112 onto a sample 114. The photomask 108 is focused with respect to the photomask imaging optics 106 such that an in-focus pattern of light corresponding to the pattern on the photomask is projected onto the sample 114 at the focal plane of the objective lens 112. The light emitted from the sample then passes back through the objective lens 112 where a portion of it passes through the mirror 110 into the camera lens, which focuses the light onto sensor 120, e.g., CCD, CMOS or similar type of sensor.

The photomask 108 can consist of some pattern of transparent windows in an opaque background. The pattern should comprise a predictable pattern of windows that can be defined by a coordinate system, such as a rectangular, square or cylindrical coordinate system. If a pattern based on a cylindrical coordinate system is used, then the mask can be spun as opposed to move in an x-y plane. Moreover, instead of pin holes, any other pattern suitable for structured illumination can be used for mask 108.

The photomask 108 is mounted such that the pattern remains in focus of the photomask imaging optics 106 even as a motion control device scans the photomask 108 laterally, sweeping the in-focus structured illumination pattern over the entire sample field of view.

In other embodiments, the a clear window can be used instead of a pinhole mask. In such a configuration, the system 100 will act as a conventional widefield imaging system.

Thus, system 100 comprises a light source 104 configured to produce illumination light 104. The source 102 can for example be a Light Emitting Diode (LED) or a Laser, depending on the implementation. Photomask imaging optics 106 can then can the collect light 102 and focus the light 102 such that an in-focus pattern of light corresponding to the pattern on the photomask is projected onto the sample 114 at the focal plane of the objective lens. Light passing through mask 108 is incident on mirror 110, such as a dichroic mirror, which directs the light onto sample 114, e.g., via objective optics 112. The light 104 is absorbed by fluorophores, which causes them to emit light 116, which passes back through objective 112 and mirror 110 an onto sensor 120. A filter 118 can filter the emissions prior the emissions being incident on sensor 120.

Figure 4:
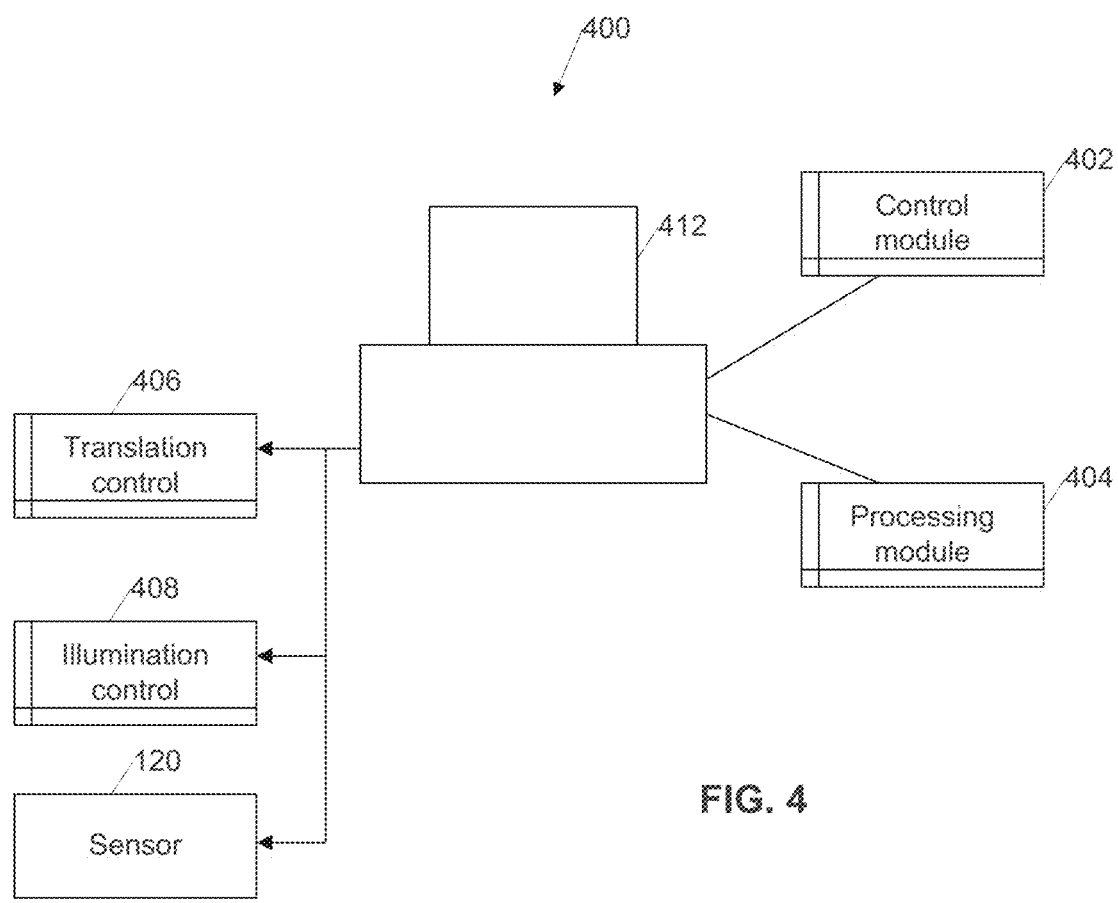
FIG. 4 is a diagram illustrating an example control system for controlling the operation of the illumination system of FIG. 1 in accordance with one embodiment.

Sensor 120 can be a Charged Coupled Device (CCD) or CMOS device. Further, the pinhole mask can be a square, rectangular, or oval mask that is moved in an x-y plane, e.g., as opposed to being rotated on a disk. FIG. 4 is a diagram illustrating an example mask 500 in accordance with one embodiment. As can be seen, mask 500 can comprise multiple pinhole masks, such as masks 501 and 502.

Figure 2:
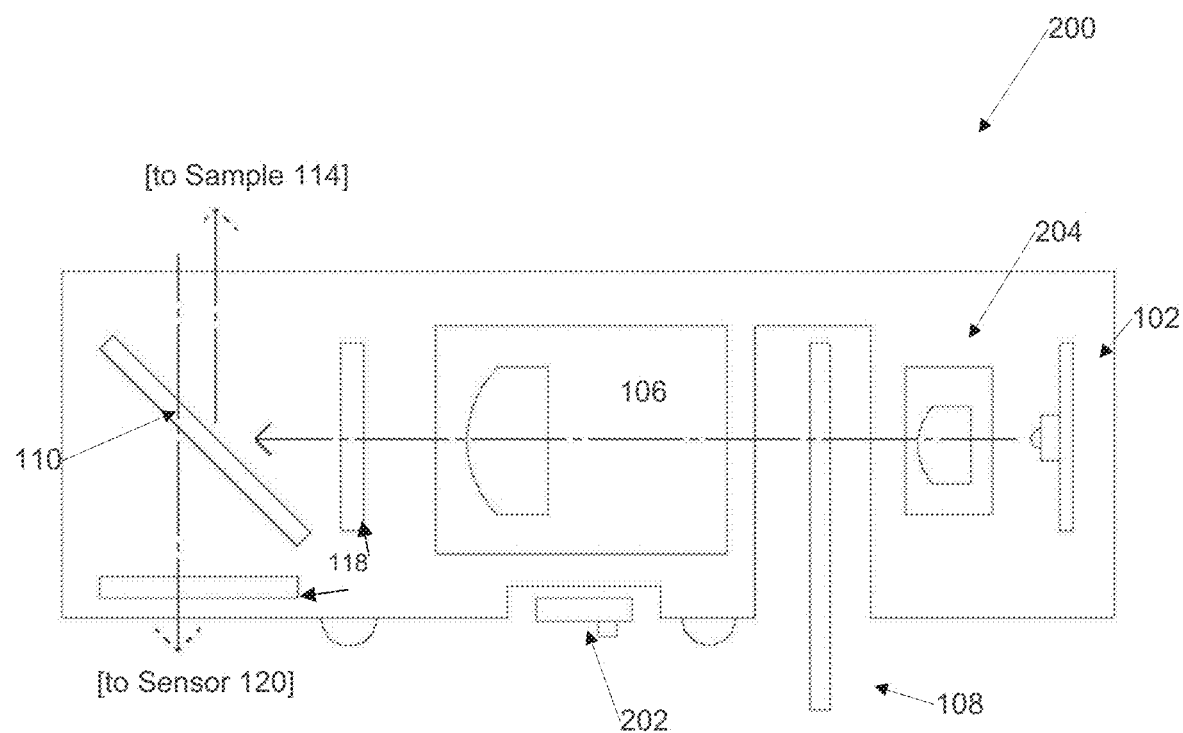
FIG. 2 is a diagram illustrating an example embodiment of a light cube implementation of at least some of the components of FIG. 1.

FIG. 2 shows a more detailed representation of light cube 200 without the context of the larger microscope around it but still with the photomask 108 in place in accordance with one embodiment. Multiple filters are present as well as mirror 110. Mirror 110 can be adjusted with mechanical positioners (not shown) relative to the orientation of the remainder of cube 200 to allow light to be properly steered into the objective lens (112 of FIG. 1) of the microscope system. The mounting features of the cube provide mechanical registration and retention points to keep the cube orientation from changing during use so as to maintain the correct alignment of cube optics 106 to photomask 108 and objective lens 112.

Since a cube 200 can be mounted on a moving axis, which allows for multiple cubes to be utilized in a single microscope without mechanically mounting and removing cubes between image captures, the mounting features serve both to locate and retain the cubes. They also allow for a cube to be removed and reinserted at a later time without recalibration of the system. A circuit board 202 allows the host system to power and control light source 102 and can, depending on the embodiment, allow the host system to identify various aspects of cube 200. These parameters may be used by the software to identify a cube 200 to the user and to configure other instrument parameters for the particular cube in use, among other things.

Thus, as illustrated in FIG. 2, the light source 102, imaging optics 106, mask 108, mirror 110 and filter 118 can be included in a very compact light cube 200. The light cube can also include a circuit board 202 that can be configured to communicate with a control system and to control various aspects of the light cube 200. Thus, the mask 500 of FIG. 4 can be configured to be inserted into light cube 200.

As noted above, images captured via conventional systems, such as disk-based raster scanning systems, can include periodic visual artifacts, e.g., such as those caused by photobleaching. While conventional methods for reducing these artifacts can be helpful, system 100 can be configured to reduce the effect of such artifacts by capturing the individual partially illuminated images in a random order each time.

Figure 3:
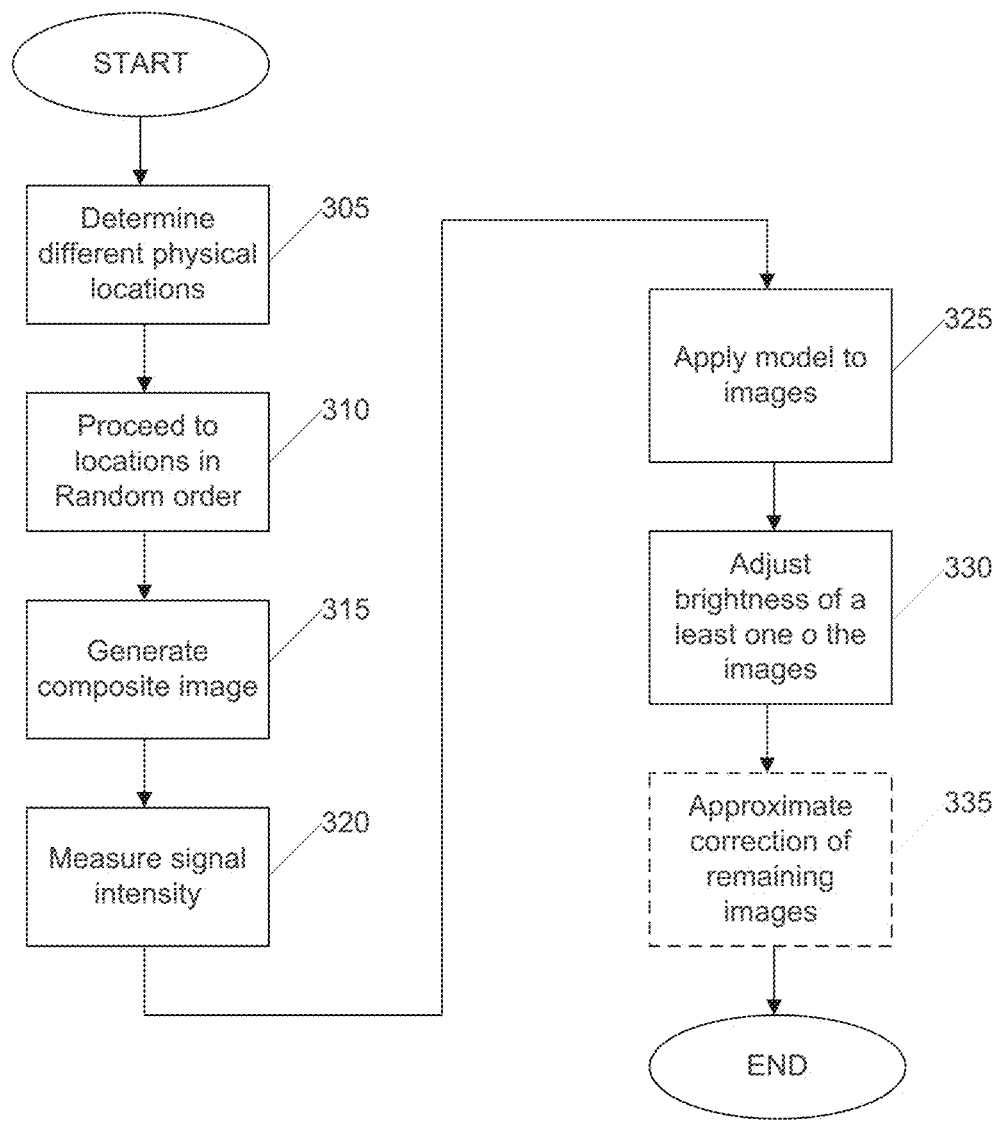
FIG. 3 is a flow chart illustrating an example process for eliminating periodic artifacts such as those produced by photobleaching in images captured using the system of FIG. 1 in accordance with one embodiment.

FIG. 3 is a flow chart illustrating an example process for eliminating periodic artifacts such as those produced by photobleaching. First, in step 305, an image control module 402, e.g., running on a control system 400 can determine the different physical locations that mask 106 must be located in order to properly construct a fully illuminated composite image. Normally, once these positions are determined, the system 400 would then control the translation stage via translation control module(s) 406 to move in a linear, serpentine, or raster fashion, i.e., it would move through each position in a certain order and capture the images. Control module 402 would normally also determine capture settings for each position and control the illumination control 408 in order to capture the images using the capture settings.

But in the embodiment of FIG. 3, the control module 402 causes the translation stage to proceed to each one of the locations in a randomized order and capture data from the pinhole locations in order to construct the images in step 310. Further, the control module 402 can be configured to cause each image to be captured with the same capture settings each time. This allows for faster individual captures, since the camera or sensor and illumination control do not have to communicate with the control system 400 to confirm new settings before each capture.

Once the images have been captured in step 310, image processing module 404 can be used to generate the composite image in step 315. The image processing module 404 can then be configured to differentiate signal from background information and measure the decrease in signal intensity at discrete steps in the capture process in step 320. A model, such as a curve that has been modeled to match the experimentally observed behavior of photobleaching, i.e., relative brightness as a function of time, can then be fit to the data points in step 325. From that curve, the brightness of all images in the sequence, except the first, can be adjusted in step 330 to eliminate some of the apparent effect of the photobleaching.

It should be noted that the composite image can be generated before or after the model is applied to the images and the brightness of various data points is adjusted.

It should also be noted that rigorously applying the process of FIG. 3 to all images can be computationally intensive and in certain instances would take too long given current processing power constraints. Thus, in certain embodiments, application of the model (step 325) can be applied to just a few images. Approximate correction of the brightness of the remaining images based on the application to a few images can then be performed as illustrated by optional step 335. For example, the model can be applied to an image at the beginning, middle and end of the order and then an exponential decay can be fit to these points. This modified process can result in a relatively quick acquisition of a good quality image.

FIG. 4 is a diagram illustrating an example control system 400 for controlling the operation of illumination system 100. As can be seen, system 400 comprises an image authority 412. Image authority 412 can comprise all of the resources need to implement certain portions of the system sand methods described herein. Thus, authority 412 can comprise all of the hardware and software resources needed for those portions including one or more processors, including any signal processors, math co-processors, microcontrollers, etc., one or more servers, one or more routers, one or more terminals, one or more computers, including desk top or portable computers, and all the API's, programs, software modules, etc., needed to perform the those portions or aspects of the systems and methods described herein. Thus, a module such as those described herein can comprise the hardware and software resources needed to perform the specified function.

Specifically, authority 412 can comprise various modules configured to control the operation of system 100 and to process data obtained therefrom. As illustrated in FIG. 4, these modules can include an image control module 402, which can be configured to control the translation stages in system 100, e.g., via a translation control module 406. Control module 402 can also be configured to control the illumination via illumination control module 408.

Authority 410 can also comprise a processing module 404 configured to process the image data obtained by sensor 120.

It should be noted that some or all of translation control module 406 and illumination control module 408 can reside within system 100, e.g., within light cube 200 or within the translation stage to which cube 200 is interfaced.

Figure 5:
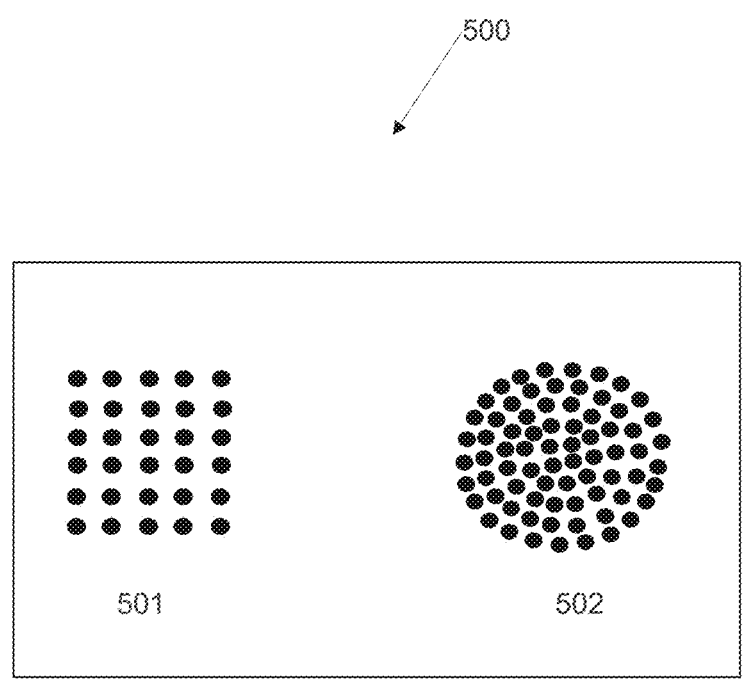
FIG. 5 is a diagram illustrating an example pinhole mask that can be used in the system of FIG. 1, and in particular in the light cube implementation of FIG. 2 in accordance with one embodiment.

As described above, instead of a spinning disk, as illustrated in FIG. 5, a pattern, e.g., of pinholes can be printed on a small, e.g., glass slide as illustrated in FIG. 4. This slide can be held in front of the excitation light source 102, e.g., as in the light cube configuration of FIG. 2. The mask is moved around using small translation stages which position the mask in the appropriate location to illuminate a different part of the sample before each capture. It will be noted, as it was above that the actual mask can comprise other patterns besides pinholes.

Figure 6A:
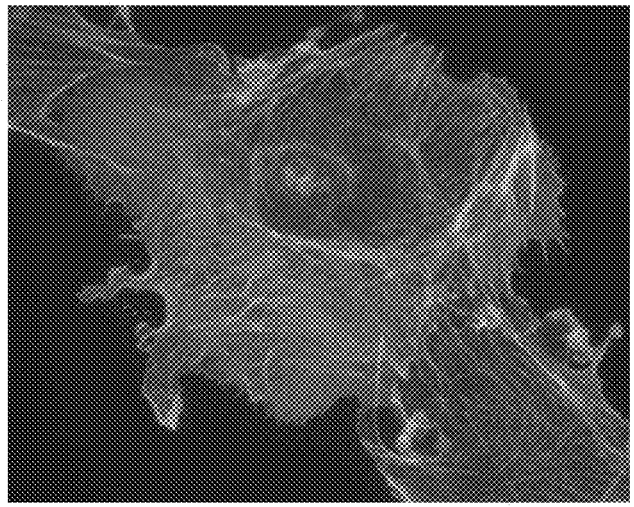
FIG. 6A illustrates an example wide-field image capture.
Figure 6B:
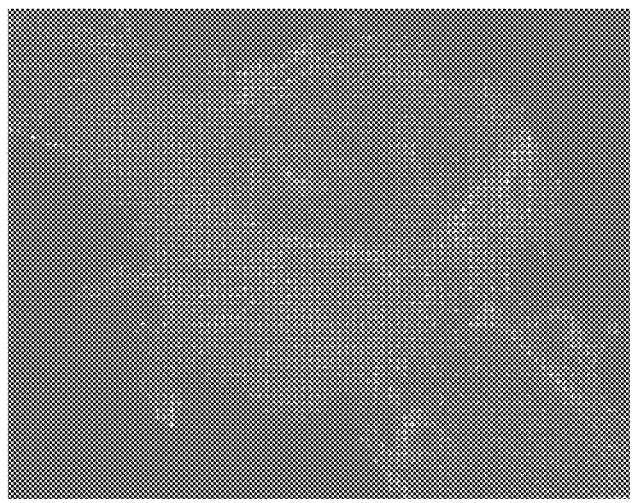
FIG. 6B illustrates a corresponding pin-hole image capture.
Figure 6C:
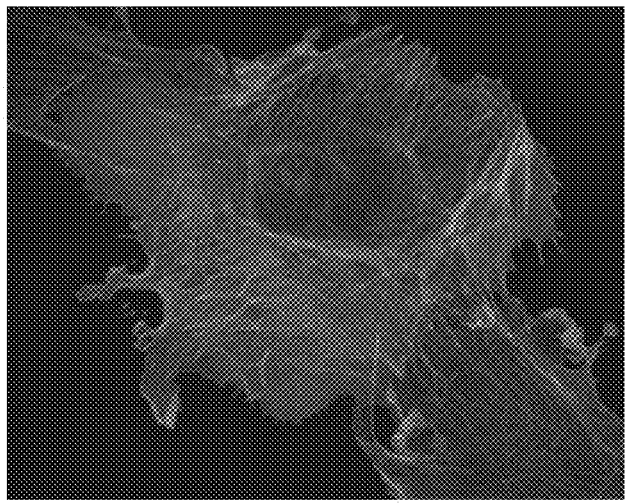
FIGS. 6C and 6D illustrate a raster scanned confocal image capture.
Figure 6D:
Figure 6E:
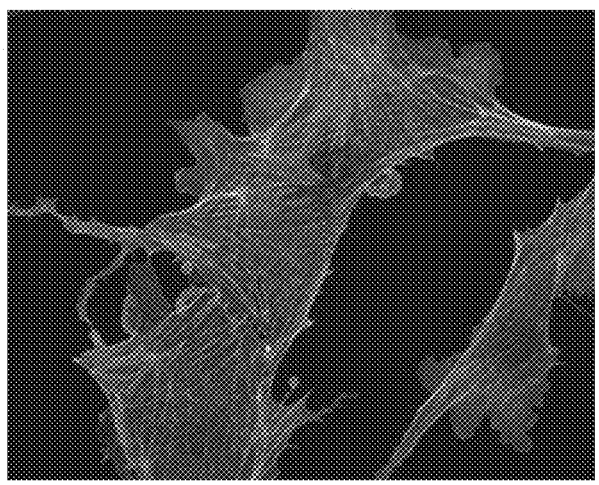
FIGS. 6E and 6F illustrate a randomly scanned image capture performed in accordance with the process of figure.
Figure 6F:
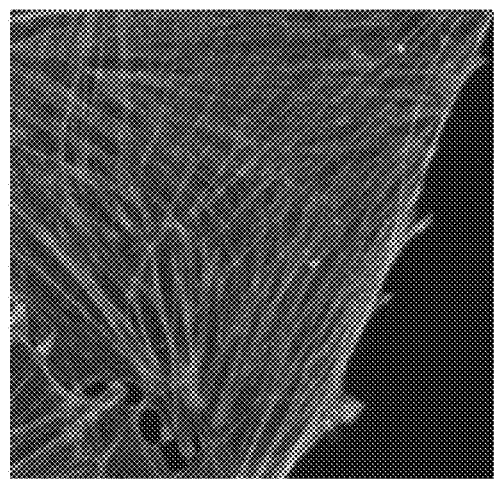

FIGS. 6A and 6B illustrate an example wide-field image capture and a corresponding pin-hole image capture. As can be seen in FIGS. 6C and D, a raster scanned confocal image can provide improved resolution and contrast; however, as illustrated in FIGS. 6E and F, the randomly scanned image capture process of FIG. 3 can provide even better resolution and contrast in less time and with fewer processing resources.

Figure 8:
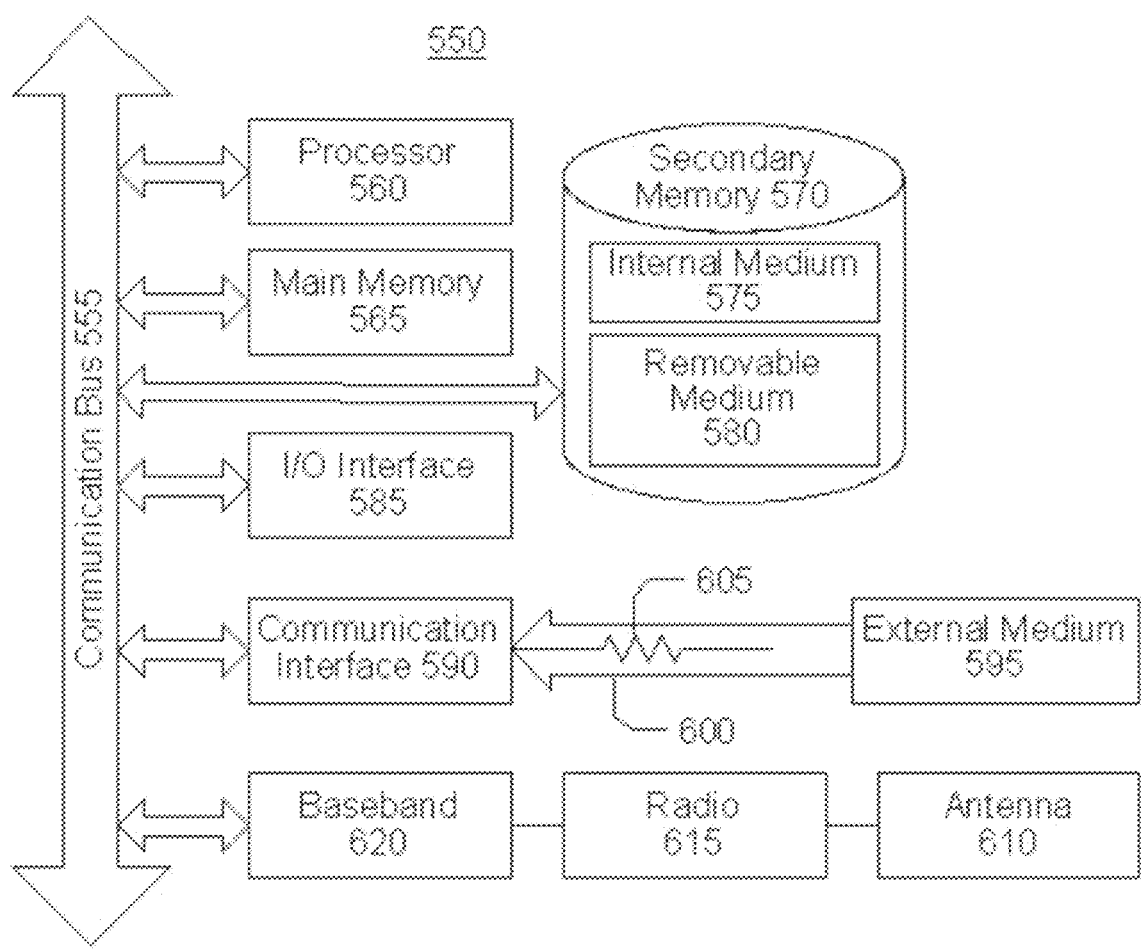
FIG. 8 is a block diagram illustrating an example wired or wireless system that can be used in connection with various embodiments described herein.

FIG. 8 is a block diagram illustrating an example wired or wireless system 550 that can be used in connection with various embodiments described herein. For example the system 550 can be used as or in conjunction with one or more of the mechanisms or processes described above, and may represent components of system 100 or 400, the corresponding server(s), and/or other devices described herein. The system 550 can be a combination of one or more of the following: a server or any conventional personal computer, or any other processor-enabled device that is capable of wired or wireless data communication. Other computer systems and/or architectures may be also used, as will be clear to those skilled in the art.

The system 550 preferably includes one or more processors, such as processor 560. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 560. Examples of processors which may be used with system 550 include, without limitation, the Pentium® processor, Core i7® processor, and Xeon® processor, all of which are available from Intel Corporation of Santa Clara, Calif.

The processor 560 is preferably connected to a communication bus 555. The communication bus 555 may include a data channel for facilitating information transfer between storage and other peripheral components of the system 550. The communication bus 555 further may provide a set of signals used for communication with the processor 560, including a data bus, address bus, and control bus (not shown). The communication bus 555 may comprise any standard or non-standard bus architecture such as, for example, bus architectures compliant with industry standard architecture (ISA), extended industry standard architecture (EISA), Micro Channel Architecture (MCA), peripheral component interconnect (PCI) local bus, or standards promulgated by the Institute of Electrical and Electronics Engineers (IEEE) including IEEE 488 general-purpose interface bus (GPIB), IEEE 696/S-100, and the like.

System 550 preferably includes a main memory 565 and may also include a secondary memory 570. The main memory 565 provides storage of instructions and data for programs executing on the processor 560, such as one or more of the functions and/or modules discussed above. It should be understood that programs stored in the memory and executed by processor 560 may be written and/or compiled according to any suitable language, including without limitation C/C++, Java, JavaScript, Pearl, Visual Basic, .NET, and the like. The main memory 565 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, including read only memory (ROM).

The secondary memory 570 may optionally include an internal memory 575 and/or a removable medium 580, for example a floppy disk drive, a magnetic tape drive, a compact disc (CD) drive, a digital versatile disc (DVD) drive, other optical drive, a flash memory drive, etc. The removable medium 580 is read from and/or written to in a well-known manner. Removable storage medium 580 may be, for example, a floppy disk, magnetic tape, CD, DVD, SD card, etc.

The removable storage medium 580 is a non-transitory computer-readable medium having stored thereon computer executable code (i.e., software) and/or data. The computer software or data stored on the removable storage medium 580 is read into the system 550 for execution by the processor 560.

In alternative embodiments, secondary memory 570 may include other similar means for allowing computer programs or other data or instructions to be loaded into the system 550. Such means may include, for example, an external storage medium 595 and an interface 590. Examples of external storage medium 595 may include an external hard disk drive or an external optical drive, or and external magneto-optical drive.

Other examples of secondary memory 570 may include semiconductor-based memory such as programmable read-only memory (PROM), erasable programmable read-only memory (EPROM), electrically erasable read-only memory (EEPROM), or flash memory (block oriented memory similar to EEPROM). Also included are any other removable storage media 580 and communication interface 590, which allow software and data to be transferred from an external medium 595 to the system 550.

System 550 may include a communication interface 590. The communication interface 590 allows software and data to be transferred between system 550 and external devices (e.g. printers), networks, or information sources. For example, computer software or executable code may be transferred to system 550 from a network server via communication interface 590. Examples of communication interface 590 include a built-in network adapter, network interface card (NIC), Personal Computer Memory Card International Association (PCMCIA) network card, card bus network adapter, wireless network adapter, Universal Serial Bus (USB) network adapter, modem, a network interface card (NIC), a wireless data card, a communications port, an infrared interface, an IEEE 1394 fire-wire, or any other device capable of interfacing system 550 with a network or another computing device.

Communication interface 590 preferably implements industry promulgated protocol standards, such as Ethernet IEEE 802 standards, Fiber Channel, digital subscriber line (DSL), asynchronous digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on, but may also implement customized or non-standard interface protocols as well.

Software and data transferred via communication interface 590 are generally in the form of electrical communication signals 605. These signals 605 are preferably provided to communication interface 590 via a communication channel 600. In one embodiment, the communication channel 600 may be a wired or wireless network, or any variety of other communication links. Communication channel 600 carries signals 605 and can be implemented using a variety of wired or wireless communication means including wire or cable, fiber optics, conventional phone line, cellular phone link, wireless data communication link, radio frequency ("RF") link, or infrared link, just to name a few.

Computer executable code (i.e., computer programs or software) is stored in the main memory 565 and/or the secondary memory 570. Computer programs can also be received via communication interface 590 and stored in the main memory 565 and/or the secondary memory 570. Such computer programs, when executed, enable the system 550 to perform the various functions of the present invention as previously described.

In this description, the term "computer readable medium" is used to refer to any non-transitory computer readable storage media used to provide computer executable code (e.g., software and computer programs) to the system 550. Examples of these media include main memory 565, secondary memory 570 (including internal memory 575, removable medium 580, and external storage medium 595), and any peripheral device communicatively coupled with communication interface 590 (including a network information server or other network device). These non-transitory computer readable mediums are means for providing executable code, programming instructions, and software to the system 550.

In an embodiment that is implemented using software, the software may be stored on a computer readable medium and loaded into the system 550 by way of removable medium 580, I/O interface 585, or communication interface 590. In such an embodiment, the software is loaded into the system 550 in the form of electrical communication signals 605. The software, when executed by the processor 560, preferably causes the processor 560 to perform the inventive features and functions previously described herein.

In an embodiment, I/O interface 585 provides an interface between one or more components of system 550 and one or more input and/or output devices. Example input devices include, without limitation, keyboards, touch screens or other touch-sensitive devices, biometric sensing devices, computer mice, trackballs, pen-based pointing devices, and the like. Examples of output devices include, without limitation, cathode ray tubes (CRTs), plasma displays, light-emitting diode (LED) displays, liquid crystal displays (LCDs), printers, vacuum florescent displays (VFDs), surface-conduction electron-emitter displays (SEDs), field emission displays (FEDs), and the like.

The system 550 also includes optional wireless communication components that facilitate wireless communication over a voice and over a data network. The wireless communication components comprise an antenna system 610, a radio system 615 and a baseband system 620. In the system 550, radio frequency (RF) signals are transmitted and received over the air by the antenna system 610 under the management of the radio system 615.

In one embodiment, the antenna system 610 may comprise one or more antennae and one or more multiplexors (not shown) that perform a switching function to provide the antenna system 610 with transmit and receive signal paths. In the receive path, received RF signals can be coupled from a multiplexor to a low noise amplifier (not shown) that amplifies the received RF signal and sends the amplified signal to the radio system 615.

In alternative embodiments, the radio system 615 may comprise one or more radios that are configured to communicate over various frequencies. In one embodiment, the radio system 615 may combine a demodulator (not shown) and modulator (not shown) in one integrated circuit (IC). The demodulator and modulator can also be separate components. In the incoming path, the demodulator strips away the RF carrier signal leaving a baseband receive audio signal, which is sent from the radio system 615 to the baseband system 620.

If the received signal contains audio information, then baseband system 620 decodes the signal and converts it to an analog signal. Then the signal is amplified and sent to a speaker. The baseband system 620 also receives analog audio signals from a microphone. These analog audio signals are converted to digital signals and encoded by the baseband system 620. The baseband system 620 also codes the digital signals for transmission and generates a baseband transmit audio signal that is routed to the modulator portion of the radio system 615. The modulator mixes the baseband transmit audio signal with an RF carrier signal generating an RF transmit signal that is routed to the antenna system and may pass through a power amplifier (not shown). The power amplifier amplifies the RF transmit signal and routes it to the antenna system 610 where the signal is switched to the antenna port for transmission.

The baseband system 620 is also communicatively coupled with the processor 560. The central processing unit 560 has access to data storage areas 565 and 570. The central processing unit 560 is preferably configured to execute instructions (i.e., computer programs or software) that can be stored in the memory 565 or the secondary memory 570. Computer programs can also be received from the baseband processor 610 and stored in the data storage area 565 or in secondary memory 570, or executed upon receipt. Such computer programs, when executed, enable the system 550 to perform the various functions of the present invention as previously described. For example, data storage areas 565 may include various software modules (not shown).

Various embodiments may also be implemented primarily in hardware using, for example, components such as application specific integrated circuits (ASICs), or field programmable gate arrays (FPGAs). Implementation of a hardware state machine capable of performing the functions described herein will also be apparent to those skilled in the relevant art. Various embodiments may also be implemented using a combination of both hardware and software.

Furthermore, those of skill in the art will appreciate that the various illustrative logical blocks, modules, circuits, and method steps described in connection with the above described figures and the embodiments disclosed herein can often be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the invention. In addition, the grouping of functions within a module, block, circuit or step is for ease of description. Specific functions or steps can be moved from one module, block or circuit to another.

Moreover, the various illustrative logical blocks, modules, functions, and methods described in connection with the embodiments disclosed herein can be implemented or performed with a general purpose processor, a digital signal processor (DSP), an ASIC, FPGA or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

Additionally, the steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium including a network storage medium. An exemplary storage medium can be coupled to the processor such that the processor can read information from, and write information to, the storage medium. In the alternative, the storage medium can be integral to the processor. The processor and the storage medium can also reside in an ASIC.

Any of the software components described herein may take a variety of forms. For example, a component may be a stand-alone software package, or it may be a software package incorporated as a "tool" in a larger software product. It may be downloadable from a network, for example, a website, as a stand-alone product or as an add-in package for installation in an existing software application. It may also be available as a client-server software application, as a web-enabled software application, and/or as a mobile application.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

The invention claimed is:

1. A method for generating a composite image obtained in a confocal fluorescence imaging system, comprising:

determining physical locations of a photomask relative to a sample required to construct a full composite confocal image;

generating, in a control module, a randomized order for the determined physical locations required to construct the full composite confocal image;

moving the photomask or the sample to the determined physical locations in the randomized order under control of the control module and using a translation stage;

illuminating the sample through the photomask using an excitation light at each of the determined physical locations and in the randomized order;

capturing a plurality of images using a sensor to generate a set of data points, the plurality of images comprising at least one image captured at each of the determined physical locations;

using the plurality of images captured in the randomized order to generate the full composite confocal image based on the set of data points;

measuring a brightness of at least some data points within the set of data points; and adjusting the brightness of the at least some data points, based on a model of certain observed imaging effects to eliminate such imaging effects in the generated full composite confocal image.

2. The method of claim 1, capturing the plurality of images comprises capturing each of the plurality of images using the same capture settings.

3. The method of claim 1, further comprising differentiating signal energy from background energy in the captured plurality of images.

4. The method of claim 1, wherein measuring the brightness of the at least some of the data points comprises measuring a decrease in signal intensity of data points at discrete steps in the capture process.

5. The method of claim 1, wherein the model is a curve of relative brightness as a function of time and wherein adjusting the brightness of the at least some of the data points comprises fitting the curve to the data points.

6. The method of claim 1, wherein the certain observed imaging effects include photobleaching.

7. The method of claim 1, wherein capturing the plurality of images, comprises capturing the plurality of images using the sensor without aid of a confocal pinhole or mask.

8. The method of claim 1, wherein moving the photomask comprises moving the photomask using motors.

9. The method of claim 1, further comprising applying the model to data points associated with only certain of the plurality of images and making approximate correction in the data points of other of the plurality of images.

10. A structured illumination imaging system, comprising:

a photomask;

a control module configured to determine physical locations of the photomask relative to a sample required to construct a full composite image of the sample and to generate a randomized order for the determined physical locations required to construct the full composite image;

an illumination source configured to illuminate the sample through the photomask using an excitation light;

one or more motors configured to move the photomask in accordance with the randomized order generated by the control module;

a sensor configured to capture a plurality of images of the sample to generate a set of data points, the plurality of images comprises at least one image captured at each of the physical locations;

an image generation module configured generate a composite image based on the set of data points, to measure brightness of at least some of the data points, and to adjust the brightness of the at least some of the data points, based on a model of certain observed imaging effects to eliminate such imaging effects in the generated image.

11. The system of claim 10, wherein the same capture settings are used to capture each of the plurality of images.

12. The system of claim 10, the image generation module is configured to differentiate signal energy from background energy in the captured images.

13. The system of claim 10, wherein measuring the brightness of the at least some of the data points comprises measuring a decrease in signal intensity of data points at discrete steps in the capture process.

14. The system of claim 10, wherein the model is a curve of relative brightness as a function of time and wherein the image generation module is configured to adjust the brightness of the at least some of the data points by fitting the curve to the data points.

15. The system of claim 10, wherein the certain observed imaging effects include photobleaching.

16. The system of claim 10, wherein the sensor is configured to capture the plurality of images without aid of a confocal pinhole or mask.

17. The system of claim 10, wherein the motors are configured to move the photomask.

18. The system of claim 10, the image generation module is further configured to apply the model to data points associated with only certain of the plurality of images and make approximate correction in the data points of other of the plurality of images.

19. The system of claim 10, wherein the photomask is a rectangular mask.

20. The system of claim 10, wherein the photomask comprises at least one pinhole pattern.

* * * * *